United States Patent [19]
Hintermaier et al.

[11] Patent Number: 6,100,187
[45] Date of Patent: Aug. 8, 2000

[54] METHOD OF PRODUCING A BARRIER LAYER IN A SEMICONDUCTOR BODY

[75] Inventors: Frank Hintermaier, München; Carlos Mazure-Espejo, Zorneding, both of Germany

[73] Assignee: Siemens Aktiengesellschaft, Munich, Germany

[21] Appl. No.: 09/106,237

[22] Filed: Jun. 29, 1998

[30] Foreign Application Priority Data

Jun. 27, 1997 [DE] Germany ................. 197 27 457

[51] Int. Cl.$^7$ ................................................ H01L 21/44
[52] U.S. Cl. ................ 438/653; 438/656; 438/669; 438/672; 438/674; 438/675
[58] Field of Search .................. 438/653, 656, 438/669, 672, 674, 675, 680, 627, 629, 643

[56] References Cited

U.S. PATENT DOCUMENTS 5,212,620  5/1993  Evans, Jr. et al. .
5,506,166  4/1996  Sandhu et al. .

FOREIGN PATENT DOCUMENTS 0 697 718 A1  2/1996  European Pat. Off. .
0 697 720 A1  2/1996  European Pat. Off. .
0 856 879 A1  8/1998  European Pat. Off. .

Primary Examiner—Carl Whitehead, Jr.
Assistant Examiner—Khanh Duong
Attorney, Agent, or Firm—Herbert L. Lerner; Laurence A. Greenberg; Werner H. Stemer

[57] ABSTRACT

A barrier layer is formed on the contact plug of the semiconductor body. The barrier layer prevents oxidation of the contact plug. The barrier layer is produced by chemically reacting a prestructured metallic transition material with one or more reaction partners.

11 Claims, 4 Drawing Sheets

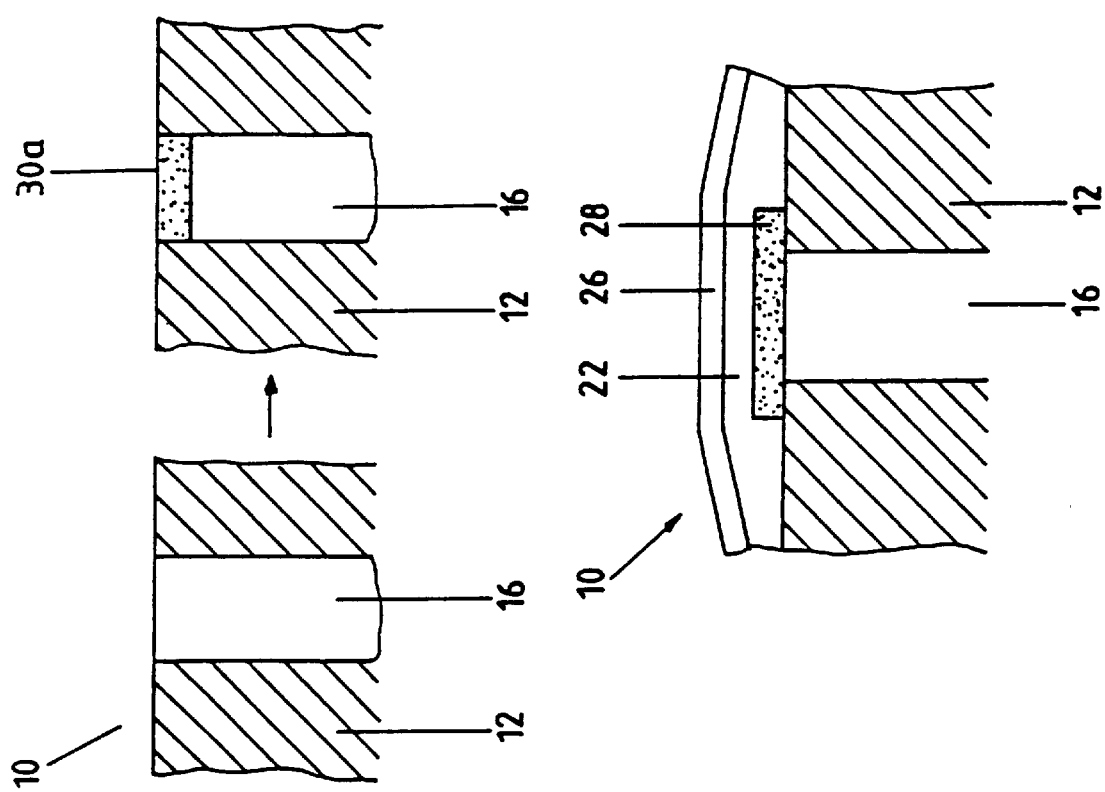

PRIOR ART

METHOD OF PRODUCING A BARRIER LAYER IN A SEMICONDUCTOR BODY

BACKGROUND OF THE INVENTION

FIELD OF THE INVENTION

The invention relates to a method of producing a barrier layer on a contact plug which is disposed in a semiconductor body and that extends substantially to a main surface of the semiconductor body. The invention also pertains to a semiconductor component with a barrier layer of this type.

Semiconductor memories consist of a plurality of memory cells, each of which have a selection transistor and a storage capacitor connected to the selection transistor. A fundamental problem in the continuing miniaturization of integrated circuits resides in the integration of these storage capacitors. Since the capacitance is proportional to their cross-sectional area and therefore to the substrate surface area which they occupy, they cannot be miniaturized in the same way as, for example, transistors.

One approach to solving this problem is to no longer use a reverse-biased pn-junction or the insulator layer (silicon dioxide and/or silicon nitride) always present in MIS or MOS technology as the dielectric of the storage capacitor, but instead to apply a dielectric layer of a material having higher dielectric constant to the semiconductor substrate specifically for this purpose.

Materials which have a high dielectric constant can be classified according to the following table in two different groups:

TABLE

|  | Paraelectric materials | Ferroelectric materials |
| --- | --- | --- |
| Property | Only high $\epsilon$, linear relationship between polarization of the dielectric and applied electric field | High $\epsilon$ + nonlinear relationship between polarization of the dielectric and applied electric field. Hysteresis loop between polarization and E-field. |
| Examples | BST (= (Ba,Sr)TiO$_3$) | PZT (= Pb(Zr, Ti)O$_3$), SBT (+ SrBi$_2$Ta$_2$O$_9$), BT (= Bi$_4$Ti$_3$O$_{11}$) |
| Application | Future DRAM generations | FRAM and Smart cards, both of which are non-volatile memories. |
| Information storage | By charging | By polarization |
| Advantages |  | no refresh needed information retained after supply voltage turned off |

FRAMs represent a further development of DRAMs: by virtue of the fact that the dielectric or paraelectric material between the plates is replaced by a ferroelectric, the information is stored as polarization and is retained after the power source has been turned off. The basic structure (selection transistor, stack capacitor, etc.) is the same in the case of DRAM and FRAM—as are many of the integration problems. For this reason, it is expedient, for example, to replace Si$_3$N$_4$ by BST, which has an $\epsilon$ of up to 600.

However, problems arise in the processing of oxide ceramic materials because the layer materials are generally deposited in an atmosphere containing oxygen. The result of this is that the electrode material next to the dielectric is oxidized, and this has a detrimental effect on its conductivity and therefore the reliability of the overall circuit. In particular, the contact plugs of the semiconductor body are compromised. This problem also arises if the so-called stack principle is adopted for the storage capacitors, a principle in which the lower electrode, which may for example consist of platinum, is in direct contact with the contact plug. The upper electrode, which for example also consists of platinum, is designed as a so-called common plate.

The representative prior art is illustrated in the sectional detail of a semiconductor component of that type in FIG. 6. The semiconductor body is denoted by the reference numeral 10 and the contact plugs by the reference numeral 16. Between the contact plugs 16 there is an oxide layer, for example TEOS. Further, doped wells 14, with which partial contact is made by the contact plugs 16 and bit lines 18, are embedded in the semiconductor body 10. Between two wells 14 there is a word line 17, in each case embedded in the oxide layer 12. The two electrode layers 26,24, with a dielectric layer 22 in between, are arranged on the upper main surface of the semiconductor body 10 in order to form the storage capacitors. The upper electrode layer is denoted by the reference numeral 26, and the lower, structured electrode layer by the reference numeral 24. After the lower electrode 24 has been processed (deposition, structuring, etc.), the dielectric material is deposited. This may, for example, be done by a physical deposition process, for example sputtering. Preferably, however, a chemical vapor deposition (CVD process) is used for this. As a rule, oxygen is present during the deposition of the dielectric. However, the material obtained in this way does not generally have optimum electrical properties. These are only obtained if it is thermally treated at fairly high temperature in $O_2$, for example BST at 650° C., SBT at 700° to 800° C. The upper electrode 26 is then deposited. To optimize the electrical properties further, another thermal treatment step generally takes place at the above-mentioned temperatures in $O_2$. Particular problems arise in this case owing to the diffusion of oxygen through the lower, structured electrode 24, which may disadvantageously lead to oxidation of the contact plug material and therefore to an interruption of the barrier layer between the contact plug 16 and the lower electrode 24. The conductivity and therefore the reliability of the overall circuit in the semiconductor body is therefore considerably impaired. In order to prevent this, barrier layers must be inserted between the contact plugs and the lower electrodes. The interposition of a barrier layer 28 of this type is represented schematically in FIG. 7.

During the production of the above-mentioned stack capacitors, both the lower electrodes 24 and the barrier layers 28 need to be structured. Because the barrier materials are especially stable, considerable problems may arise during these structuring processes. For this reason, the barrier layers have to date usually been deposited in a sputtering process and then subsequently structured separately, for example by physical etching.

SUMMARY OF THE INVENTION

It is accordingly an object of the invention to provide a method of producing a barrier layer in a semiconductor body and a semiconductor component with such a barrier layer, which overcomes the above-mentioned disadvantages of the prior art devices and methods of this general type and wherein the process is simplified but nevertheless reliable and the process results in an advantageous semiconductor component with a barrier layer thus produced.

With the foregoing and other objects in view there is provided, in accordance with the invention, a semiconductor production process, which comprises:

providing a semiconductor body with a main face and a contact plug extending in the semiconductor body and substantially to the main face thereof;

producing a barrier layer on the contact plug by chemically reacting a prestructured metallic transition material with at least one reaction partner.

In other words, novel process proposes in situ production of the barrier layer by chemically reacting a prestructured transition metal or a transition metal alloy with at least one suitable reaction partner. In particular, conversion of the transition metal or of the transition metal alloy with non-metallic hydrocarbons may be employed for producing the barrier material.

In accordance with an added feature of the invention, the producing step comprises thermally treating the prestructured metallic transition material in a reactive chemical atmosphere of the at least one reaction partner.

A variety of processes may be employed for prestructuring the metallic transition material, that is to say the transition metal or the transition metal alloy. After the metallic transition material has been prestructured, the invention proposes, in accordance with a further feature of the invention, to carry out thermal treatment in a reactive chemical atmosphere of at least one suitable reaction partner.

A further advantage is that the barrier is no longer deposited because it is produced in situ. On account of the special properties of these materials, the deposition of barrier materials often entails great difficulties, while the deposition of transition metals is a standard process in semiconductor fabrication.

In accordance with an additional feature of the invention, the transition material is prestructured by depositing a layer of the transition material on the semiconductor body and subsequently structuring the layer of transition material.

In accordance with a further feature of the invention, the step of prestructuring comprises an etching process selected from the group consisting of chemical/physical gas phase etching and dry etching.

In other words, one possible way of prestructuring the metallic transition material is to deposit the transition material on the semiconductor body, and to subsequently structure the layer, for example chemical/physical gas phase etching or dry etching. The transition material may, for example, be deposited using the known, conventional sputtering process or by evaporation, the required structures being produced from this deposited layer by a suitable photographic technique or etching steps. The advantage of such a separate structuring step for the deposited transition material is that, on account of their higher chemical reactivity, the structuring of metals is easier to carry out than the structuring of pure barrier layers.

In accordance with an alternative feature of the invention, the transition material is structured with a selective CVD process wherein the metallic transition material is deposited, locally limited, on the contact plugs in the semiconductor body. The transition material is thereby deposited only on the contact plugs, or only covers them to some extent. In contrast, the oxide layer, for example TEOS, next to the contact plugs remains free and is not covered with the transition material. During the selective CVD process, the transition material is thus grown on the semiconductor body only selectively, that is to say exclusively, on quite specific regions with which contact is to be made.

In accordance with again another feature of the invention, the barrier layer is produced by thermally treating the metallic transition material in ammonia at a temperature of about 400° to 700° C. and forming a nitride transition metal layer barrier layer as an oxygen barrier.

The process according to the invention makes use of the fact that a plurality of non-metal hydrocarbons react with metallic transition materials with the elimination of hydrogen and liberation of the non-metal component. This non-metal component can react with the metallic transition material, that is to say the transition metal or the transition metal alloy, with the formation of a new chemical phase.

Should, for example, a nitride transition metal barrier layer be provided as the barrier layer, the metallic transition material, for example, titanium Ti, tungsten W, molybdenum Mo, Tantalum Ta may, amongst other things be thermally treated in ammonia $NH_3$ in order to produce nitrides. The reaction, i.e. the elimination of hydrogen and the liberation of the non-metal component, takes place in this case at a temperature of about 400° to 700° C. The relevant reaction equation is:

$$M+xNH_3 \rightarrow MNx+3/2xH_2,$$

where M=Ti, W, Mo, Ta . . .

In accordance with again an additional feature of the invention, the barrier layer is a carbide barrier layer formed by reacting alkanes with the metallic transition material. More specifically, the carbide barrier layer may be formed by thermally treating tungsten at a temperature of up to about 1000° C. with methane. By way of advantageous example, the thermal treatment is performed for about 30 minutes. Tungsten W reacts, for example at about 850° C., with methane with the formation of WC and the elimination of hydrogen. The relevant reaction equation is

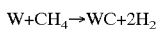
$$W+CH_4 \rightarrow WC+2H_2$$

It is within the scope of the invention to assist the reaction in this case using a suitable plasma.

In accordance with again a further feature of the invention, the barrier layer is a phosphide barrier layer formed by converting the metallic transition material with phosphanes. Phosphide barriers result from the conversion of the metallic transition material with phosphanes. One example of this is the conversion of tungsten W with $PH_3$. The relevant reaction equation is

$$W+xPH_3 \rightarrow WPx+3/2xH_2.$$

In accordance with yet a further feature of the invention, the barrier layer comprises transition metal borides formed by reacting $B_2H_6$ with the metallic transition material. The relevant reaction equation is

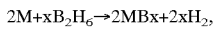
$$2M+xB_2H_6 \rightarrow 2MBx+2xH_2,$$

where M is the metallic transition material selected from the group Ti, W, Mo, Ta, etc.

In accordance with yet a further feature of the invention, an upper end of the contact plug ends below the main surface of the semiconductor body, and wherein the producing step comprises introducing the barrier layer in a direction towards the main surface of the semiconductor body.

In accordance with yet again a further feature of the invention, the metallic transition material is applied onto or into the semiconductor body, and the metallic transition material is converted only partially into the barrier layer subsequently to the applying step.

In accordance with another feature of the invention, the contact plug consists of the metallic transition material, and which comprises thermally treating the semiconductor body and converting an upper region of the contact plug at the main surface into the barrier layer.

In accordance with a concomitant feature of the invention, a storage capacitor is formed with a dielectric layer directly in contact with the barrier layer and without an electrode layer in between.

With the above and other objects in view there is provided, in accordance with the invention, a semiconductor component, comprising:

a semiconductor body with a main face;

a contact plug extending in the semiconductor body and substantially to the main face thereof; and a barrier layer disposed on the contact plug at the main face of the semiconductor body, the barrier layer being a layer formed by a chemical reaction of a prestructured metallic transition material with at least one reaction partner.

Finally, the invention provides for a component in which the contact plug is one of a plurality of contact plugs disposed in the semiconductor body, and which further comprises a plurality of storage capacitors having a dielectric layer directly in contact with the barrier layer and without an electrode layer in between.

The process according to the invention is suitable, in particular, for the production of semiconductor memory components for which a quite decisive aspect consists in the miniaturization of the storage capacitors. In particular, the process according to the invention is suitable for the production of DRAM and FRAM semiconductor memory components.

Other features which are considered as characteristic for the invention are set forth in the appended claims.

Although the invention is illustrated and described herein as embodied in a process for the production of a barrier layer in a semiconductor body, and a semiconductor component having a barrier layer of this type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 are three sectional views of a semiconductor body after various production steps according to a fourth exemplary embodiment of the novel process;

FIG. 5 is a sectional view through a semiconductor body according to a fifth exemplary embodiment of the process according to the invention;

DESCRIPTION OF THE PREFERRED EMBODIMENTS

Figure 1A:
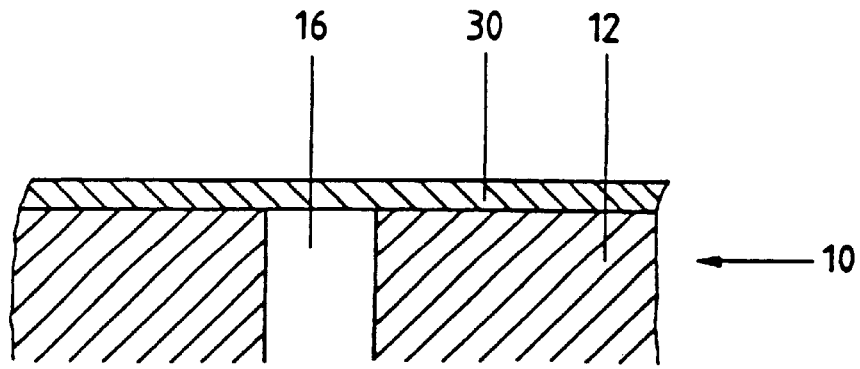
FIGS. 1A–1C are three partial, sectional views of a semiconductor body following various production steps according to a first exemplary embodiment of the invention.
Figure 1B:
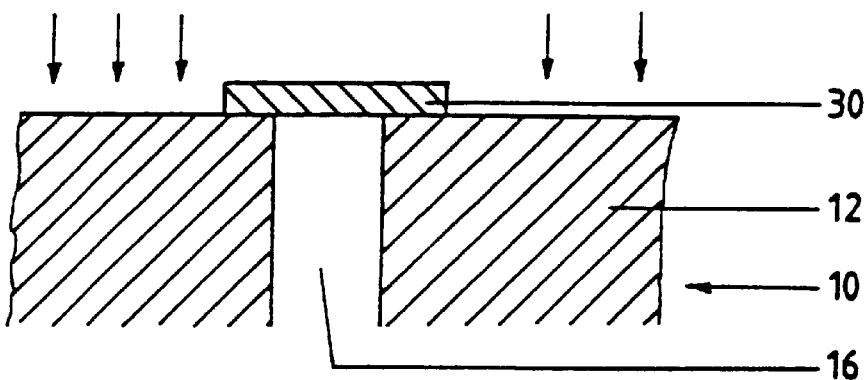
Figure 1C:
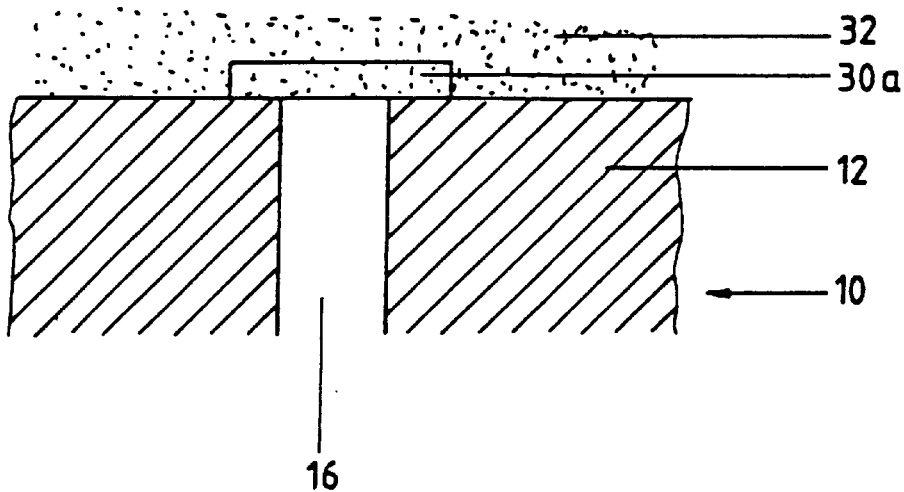

Reference is now had to the figures of the drawing and first, particularly, to FIGS. 1A to 1C thereof. After the processing, for example, of a plurality of C-MOS transistors with bit lines, word lines and contact plugs, but still without the formation of the storage capacitors, a layer 30 of metallic transition material, for example tungsten W, is deposited on the upper main surface of the semiconductor body. In the exemplary case, the transition material 30 touches and makes contact with the contact plug 16 which extends as far as the main surface of the semiconductor body 10. Further, the transition material 30 also touches the oxide layer 12 arranged around the contact plug 16. The transition material 30 may, for example, be applied to the main surface of the semiconductor body 10 by a suitable sputtering process or by evaporation. By way of example, argon Ar at a pressure of 5 mtorr (0.667 Pa) may be provided as the sputtering gas.

With reference to FIG. 1B, the deposited transition material 30 is structured in the next processing step. This may be carried out, for example, by a dry etching process which takes place in $Ar/O_2$ plasma. The structuring is in this case carried out in such a way that the transition material 30 still fully overlaps the upper side of the contact plug 16, but the remaining regions of the main surface of the semiconductor body 10, where only the oxide layer 12 is still present, are partly or fully exposed.

With reference to FIG. 1C, the entire semiconductor body is then thermally treated in methane $CH_4$ at about 1000° C. for about 30 minutes. The result of this is that the transition material tungsten W is converted into the carbide barrier WC. The carbide barrier layer is marked in FIG. 1C with the reference numeral 30a, and the reaction partner methane with the reference numeral 32. The barrier layer is in this way fabricated on the contact plug 16. In the next step, the electrode layer is applied to the semiconductor body. The electrode layer forms the lower electrode of the stack capacitor.

Unlike in the illustrative embodiment represented in FIG. 1, it is within the scope of the process according to the invention to use a selective CVD process instead of the process steps shown in FIGS. 1A and 1B. In that case, the transition material tungsten W is deposited selectively on the contact plug 16, which for example may also consist of tungsten W. This selective CVD process may, for example, be carried out with $WF_6$ and $H_2$ in a ratio of 1:15. By way of example, the process parameters of 400° C. and 10 mtorr (1.3 Pa) may be set. Argon Ar may be used as the carrier gas.

Figure 2:
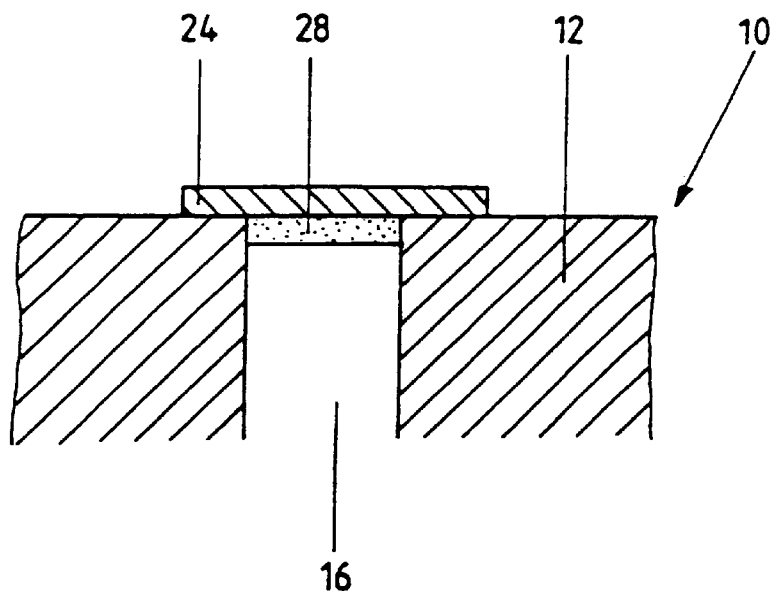
FIG. 2 is a partial sectional view through another semiconductor body, which is produced in accordance with a second exemplary embodiment of the novel process.

FIG. 2 likewise represents a semiconductor body 10 which is suitable for the formation of a storage capacitor. The semiconductor body 10, details of which have been represented merely for the sake of clarity, again has an oxide layer 12 in which a contact plug 16 is located. In contrast to the exemplary embodiment in FIG. 1, however, the contact plug 16 does not extend all the way to the main surface of the semiconductor body 10, but ends a fairly short distance below it. The first electrode layer 24 is already located flat on the main surface of the semiconductor body 10. The barrier layer 28, which has been produced using the process according to the invention, is located between this first electrode layer 24, which forms the lower electrode for the storage capacitor, and the upper side of the contact plug 16. The barrier layer 28 is thus set back somewhat in the direction of the contact plug 16 from the upper main surface of the semiconductor body 10.

Figure 3:
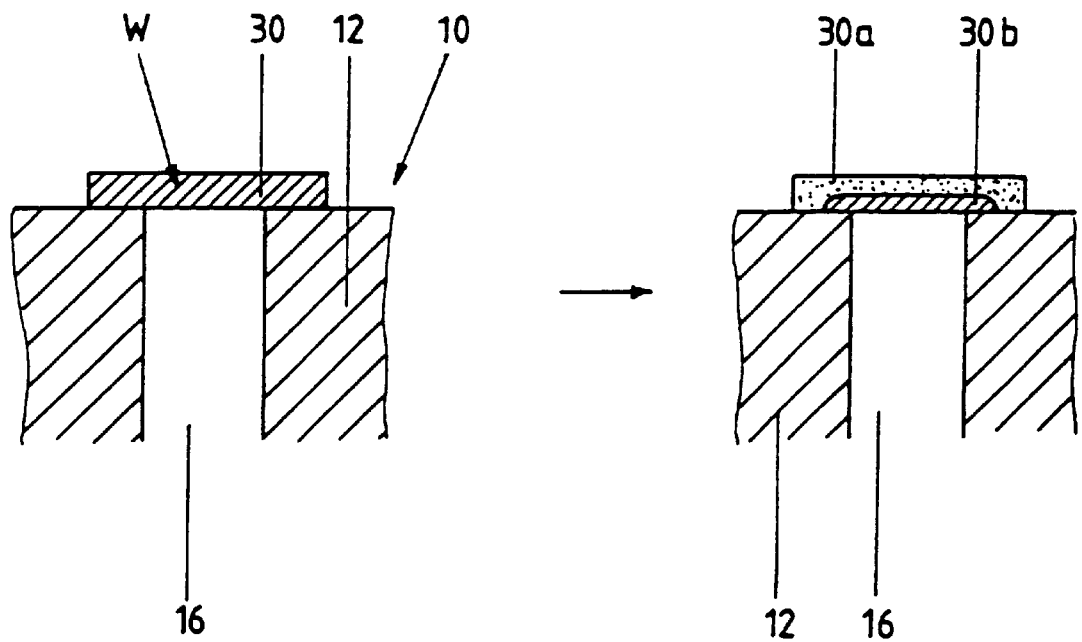
FIG. 3 are two sectional views of a semiconductor body after various production steps according to a third exemplary embodiment of the process according to the invention.
Figure 6:
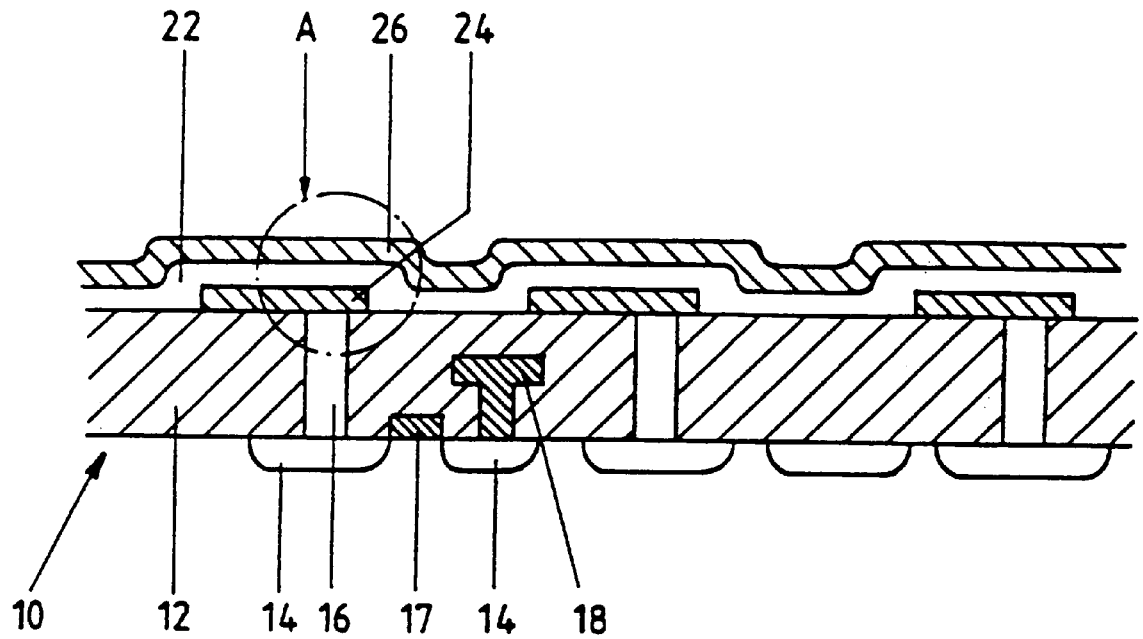
FIG. 6 is a partial sectional view taken through a prior art semiconductor body.
Figure 7:
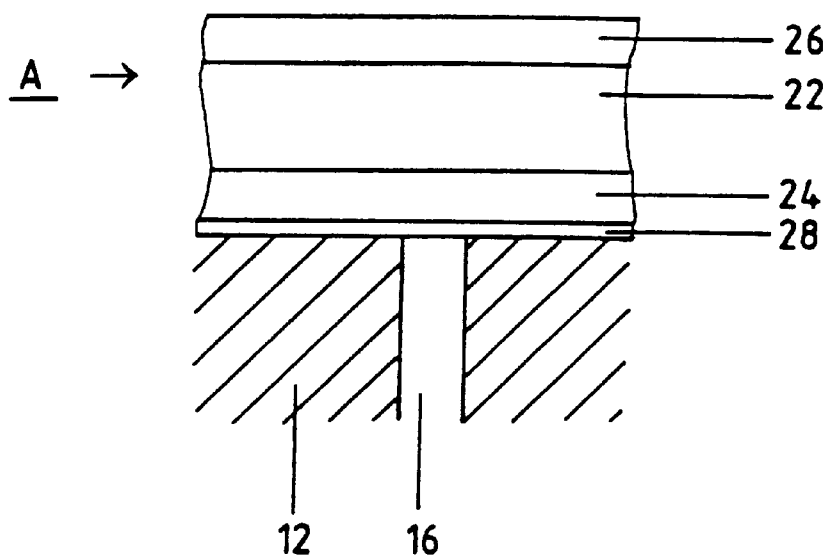
FIG. 7 is an enlarged view of a detail A in FIG. 6.

A further embodiment of the invention is represented with the aid of the two partial sectional views of a semiconductor body 10 in FIG. 3. Not all of the transition metal has in this exemplary embodiment been converted into the barrier layer 28, but only a first lower level. In the sectional view in FIG.

3, on the left, a metallic transition material 30 is applied to the upper main surface of the semiconductor body 10 (as explained in conjunction with FIG. 1). In the represented illustrative embodiment in FIG. 3, tungsten W has been deposited selectively on the contact plug 16. In the next step, which is shown on the right-hand side of FIG. 3, the metallic transition material 30, that is to say tungsten, is converted by chemical reaction with at least one reaction partner into a two-level layer, namely an unmodified lower layer of metallic transition material 30b, which is in direct contact with the contact plug 16, and an overlying level, which forms the barrier layer 30a. A structure of this type may, for example, be obtained by choosing a thermal treatment step which is kept relatively short, so that the applied and structured metallic transition material cannot be fully converted into the barrier layer.

The three-section series of FIG. 4 illustrates the semiconductor body after various production steps. In the embodiment in FIG. 4, the contact plug 16 consists of tungsten. The contact plug 16 extends up to the upper main surface of the semiconductor body 10. By thermal treatment of the semiconductor body in $CH_4$, the upper part of the contact plug 16 is converted into WC. This region is marked with dots and labeled with reference numeral 30a. The region marked with the reference numeral 30a again consists of WC and serves as the barrier layer 30a. By way of example, the lowermost electrode 24 of a storage capacitor which is to be produced may then be applied to the main surface of the semiconductor body 10.

FIG. 5 represents a further variant of the semiconductor body. Unlike in the previous illustrative embodiments, the lower electrode, which connects the contact plug 16 to the dielectric layer, is omitted for forming a storage capacitor. Specifically, according to this embodiment, the lower electrode is left out and the dielectric layer 22 is applied directly to the barrier layer 28. The electrode layer 26 which forms the upper electrode of a storage capacitor is located on the dielectric layer 22.

We claim:

1. A semiconductor production process, which comprises:
   providing a semiconductor body with a main face and a contact plug extending in the semiconductor body and substantially to the main face thereof;
   producing a barrier layer on the contact plug by chemically reacting a prestructured metallic transition material with at least one reaction partner; and
   prestructuring the transition material by depositing a layer of the transition material on the semiconductor body and subsequently structuring the layer of transition material.

2. The process according to claim 1, wherein the step of prestructuring comprises an etching process selected from the group consisting of chemical/physical gas phase etching and dry etching.

3. A semiconductor production process, which comprises:
   providing a semiconductor body with a main face and a contact plug extending in the semiconductor body and substantially to the main face thereof;
   producing a barrier layer on the contact plug by chemically reacting a prestructured metallic transition material with at least one reaction partner; and
   prestructuring the transition material with a selective CVD process wherein the metallic transition material is deposited, locally limited, on the contact plugs in the semiconductor body.

4. A semiconductor production process, which comprises:
   providing a semiconductor body with a main face and a contact plug extending in the semiconductor body and substantially to the main face thereof; and
   producing a barrier layer on the contact plug by chemically reacting a prestructured metallic transition material with at least one reaction partner being a nonmetallic hydrocarbon.

5. A semiconductor production process, which comprises:
   providing a semiconductor body with a main face and a contact plug extending in the semiconductor body and substantially to the main face thereof; and
   producing a barrier layer on the contact plug by chemically reacting a prestructured metallic transition material with at least one reaction partner by thermally treating the metallic transition material in ammonia at a temperature of about 400° to 700° C. and forming a nitride transition metal layer barrier layer as an oxygen barrier.

6. A semiconductor production process, which comprises:
   providing a semiconductor body with a main face and a contact plug extending in the semiconductor body and substantially to the main face thereof; and
   producing a barrier layer on the contact plug by chemically reacting a prestructured metallic transition material with at least one reaction partner, the barrier layer being a carbide barrier layer formed by reacting alkanes with the metallic transition material.

7. The process according to claim 6, which comprises forming the carbide barrier layer by thermally treating tungsten at a temperature of up to about 1000° C. with methane.

8. The process according to claim 7, wherein the thermally treating step is performed for about 30 minutes.

9. A semiconductor production process, which comprises:
   providing a semiconductor body with a main face and a contact plug extending in the semiconductor body and substantially to the main face thereof; and
   producing a barrier layer on the contact plug by chemically reacting a prestructured metallic transition material with at least one reaction partner, the barrier layer being a phosphide barrier layer formed by converting the metallic transition material with phosphanes.

10. A semiconductor production process, which comprises:
    providing a semiconductor body with a main face and a contact plug extending in the semiconductor body and substantially to the main face thereof; and
    producing a barrier layer on the contact plug by chemically reacting a prestructured metallic transition material with at least one reaction partner, the barrier layer comprising transition metal borides formed by reacting $B_2H_6$ with the metallic transition material.

11. A semiconductor production process, which comprises:
    providing a semiconductor body with a main face and a contact plug extending in the semiconductor body and substantially to the main face thereof;
    producing a barrier layer on the contact plug by chemically reacting a prestructured metallic transition material with at least one reaction partner; and
    forming a storage capacitor with a dielectric layer directly in contact with the barrier layer and without an electrode layer in between.

\* \* \* \* \*